(12) United States Patent
Maindron et al.

(10) Patent No.: US 8,638,032 B2
(45) Date of Patent: Jan. 28, 2014

(54) ORGANIC OPTOELECTRONIC DEVICE COATED WITH A MULTILAYER ENCAPSULATION STRUCTURE AND A METHOD FOR ENCAPSULATING SAID DEVICE

(75) Inventors: Tony Maindron, Grenoble (FR); Christophe Prat, Coueron (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 306 days.

(21) Appl. No.: 13/121,520

(22) PCT Filed: Sep. 23, 2009

(86) PCT No.: PCT/FR2009/001124
§ 371 (c)(1),
(2), (4) Date: Apr. 7, 2011

(87) PCT Pub. No.: WO2010/037920
PCT Pub. Date: Apr. 8, 2010

(65) Prior Publication Data
US 2011/0198627 A1    Aug. 18, 2011

(30) Foreign Application Priority Data
Sep. 30, 2008  (FR) ...................................... 08 05381

(51) Int. Cl.
*H01J 1/62* (2006.01)
(52) U.S. Cl.
USPC ......................................... 313/504; 313/553
(58) Field of Classification Search
USPC ................................................ 313/553, 504
See application file for complete search history.

(56) References Cited

U.S. PATENT DOCUMENTS 5,686,360 A *  11/1997  Harvey et al. .................... 438/28
6,465,853 B1 *  10/2002  Hobbs et al. .................. 257/410

FOREIGN PATENT DOCUMENTS

| EP | 1 788 648 A2 | 5/2007 |
|---|---|---|
| JP | 2003-048271 A | 2/2003 |
| JP | 2004-288473 A | 10/2004 |
| JP | 2007-053041 A | 3/2007 |
| WO | WO 01/82389 A1 | 1/2001 |
| WO | WO 2008/057045 A1 | 5/2008 |

OTHER PUBLICATIONS

Written Opinion for International Application No. PCT/FR2009/001124.

* cited by examiner

*Primary Examiner* — Howard Weiss
*Assistant Examiner* — Steven Rao
(74) *Attorney, Agent, or Firm* — Alston & Bird LLP

(57) ABSTRACT

The invention relates to an organic optoelectronic device, such as a display, lighting or signalling device, that is protected from the ambient air by a sealed encapsulation in the form of a thin film, and to a method for encapsulating such a device. An optoelectronic device (1) according to the invention is coated with a sealed multi-layer encapsulation structure (20) comprising alternating inorganic layers (21a to 26a) and organic layers (21b to 25b). According to the invention, the device is such that at least one of said organic layers consists of a crosslinked adhesive film (21b to 25b) based on a glue that can be crosslinked thermally or by electromagnetic radiation, the or each adhesive film having a thickness uniformly lower than 200 n, said thickness being obtained by passing the film, which is deposited and not yet cross-linked, through a vacuum, such that the total thickness of the encapsulation structure is minimized.

19 Claims, 1 Drawing Sheet

ORGANIC OPTOELECTRONIC DEVICE COATED WITH A MULTILAYER ENCAPSULATION STRUCTURE AND A METHOD FOR ENCAPSULATING SAID DEVICE

FIELD OF THE INVENTION

The present invention relates to an organic optoelectronic device, such as a display, lighting or signaling device, which is protected from ambient air by an impermeable, thin-film encapsulation, and to a process for encapsulating such a device. The invention is applied for example to devices comprising organic light-emitting diodes (OLEDs), such as microscreens or microdisplays, to photovoltaic cells or else to organic thin-film transistors (TFTs), in a nonlimiting way.

BACKGROUND OF THE INVENTION

As is known, organic optoelectronic devices such as OLEDs, devices comprising photovoltaic cells, and those comprising organic TFTs, need to be encapsulated to protect their sensitive components from gaseous species in the atmosphere (mainly oxygen and water vapor). This is because, if suitable protection is not in place, there is a risk that the device will subsequently degrade, which degradation manifests itself mainly through the appearance of black, non-emissive spots, in the case of OLEDs, which are in fact a result of water vapor penetrating into the diode, thereby degrading the cathode (or anode)/organic film interface.

This encapsulation may typically be produced using a glass cap bonded onto the organic device using a specific adhesive, especially one having low water permeability. In general, a solid moisture getter is added between the substrate and the cap to prolong the lifetime of the device. Encapsulation with a cap is well suited to rigid devices, but it is not well suited to devices comprising flexible supports (e.g. flexible displays). This encapsulation technique is also unfeasible in the case where space is lacking on the circuit of the substrate, for example in a CMOS (complementary metal-oxide semiconductor) microdisplay, and it is to be avoided if it is desired to minimize the weight of the device, in particular in the case of large emission areas.

In all these cases where encapsulation with a cap is not suitable, what is called "monolithic" encapsulation is generally adopted, i.e. encapsulation using thin films having good oxygen-barrier and water-vapor-barrier qualities, in particular. The materials most commonly used for this application are in general dielectric oxides and/or nitrides of formula $SiO_x$, $SiN_x$, $SiO_xN_y$ and $Al_xO_y$ usually deposited using chemical vapor deposition (CVD), optionally plasma-enhanced (PECVD), or atomic layer deposition (ALD), which techniques are preferred to physical vapor deposition (PVD) which, like sputtering, are most of the time too aggressive with respect to organic semiconductors or else lead to the formation of films having properties that are unsatisfactory for barrier applications due to the many pinhole-type defects found in these evaporated films. PECVD and ALD techniques have the advantage of being highly conformal (i.e. they provide excellent step coverage) for the films deposited, which have far fewer defects than films obtained using PVD techniques.

Single inorganic layer encapsulation structures currently obtained using these PECVD or ALD techniques nevertheless have atmospheric gas impermeability properties that are unsatisfactory due to the defects that remain in these layers whatever is done. For example, if it is decided to improve the water vapor impermeability of a commercially available PET film having a permeability of about 1 $g/m^2/day$ by depositing on the surface thereof, using low-temperature PECVD, an inorganic film of silicon nitride (the case of food packaging), this impermeability is at best improved by a factor of 100 and the PET/$SiN_x$ multilayer will then have, in the best case scenario, a water vapor permeability of about $10^{-2}$ $g/m^2/day$.

In order to further reduce this water vapor permeability attempts have recently been made to produce organic/inorganic/organic/inorganic/etc. multilayers, such as those sold under the brand name Barix®, wherein the polymer underlayer of each organic/inorganic dyad is deposited by vacuum evaporation, allowing the defects of one inorganic layer to be "decorrelated" from those of another in order to make the path traveled by the water vapor more circuitous and thus impede the diffusion of the water vapor through the encapsulation structure. In this way, it is possible at the present time to reduce the water vapor permeability of such a structure to values of about $10^{-6}$ $g/m^2/day$, thereby procuring sufficient lifetime that commercialization of OLED display devices may be envisioned.

Another large family of multilayer encapsulation structures is marketed by Philips under the brand name "NONON" and consists of a multilayer comprising an alternation of nitride and oxide layers, for example $SiN_x/SiO_x/SiN_x/SiO_x/$etc.

Mention may also be made, for OLED device encapsulation, of the multilayer structure described in document US-A-2007/0184292, comprising an internal organic/inorganic multilayer surmounted by an external multilayer comprising two polymer layers which are joined together by an adhesive layer whereof the two interfaces with these polymer films are formed from two heat-cured films.

A major drawback of multilayer structures comprising alternating organic and inorganic layers, such as Barix® structures, lies in the relatively large thickness (in general greater than 500 nm) of each polymer layer sandwiched between two inorganic layers, thereby leading to a large total thickness for the structure formed from n organic/inorganic dyads, in order to obtain the desired oxygen and water vapor impermeability properties. Thus, for four of these dyads, it is easily possible to exceed a thickness of 2 μm, which is unfeasible for certain devices, such as microdisplays on CMOS substrates, which require very thin encapsulations. This is because, the quality of these microdisplays depends on the aperture ratio between the area of each light-emitting pixel and that of the corresponding color filter, which is usually placed on the internal side of the transparent protective cap bonded to the microdisplay, which ratio is directly related to the distance separating the color filters from the pixels and therefore to the thickness of the encapsulation structure and/or the adhesive surmounting the microdisplay.

SUMMARY OF THE INVENTION

One object of the present invention is to provide an organic optoelectronic device, such as a display, lighting or signaling device, for example comprising organic light-emitting diodes (OLEDs), photovoltaic cells, or organic thin-film transistors (TFTs), which alleviates these drawbacks, this device being coated with an impermeable multilayer encapsulation structure comprising an alternation of inorganic layers and organic layers.

For this purpose, a device according to the invention is such that at least one of these organic layers is formed by a cured adhesive film based on an electromagnetic-radiation-curable or heat-curable adhesive (i.e. curable at a high temperature for the organic films, typically between 80 and 100° C.), the or each adhesive film having a thickness uniformly less than 200 nm, which thickness is obtained by exposing the as yet uncured deposited film to vacuum so that the total thickness of the encapsulation structure is minimized.

It will be noted that, for a given number of inorganic/organic dyads, and for comparable barrier properties, the thickness of the encapsulation structure according to the invention is thus substantially reduced in comparison with the thickness of a Barix® structure, in which each organic film generally has a thickness of more than 500 nm. As a result, a device according to the invention may have, compared to these Barix® structures, an encapsulation that is thin enough for use in applications such as microdisplays on CMOS substrates, or else, for a structure of a given total thickness, further improved barrier properties, due to a larger number of dyads.

Advantageously, said encapsulation structure may comprise at least three dyads each comprising one of said inorganic layers and one of said organic layers.

According to another feature of the invention, said inorganic layers may respectively form in said structure an internal inorganic layer, at least one intermediate inorganic layer placed between two of said organic layers, and an external inorganic layer.

Preferably, each of said organic layers is formed by the adhesive film according to the invention. In this preferred case, each dyad thus comprises said adhesive in the organic layer thereof, it being specified that the chemical and/or thickness characteristics of each adhesive film may vary from one dyad to another.

According to another feature of the invention, said or each adhesive film may have a thickness of 150 nm or less, which thickness is advantageously obtained by exposure to vacuum (at least a rough vacuum), for example implemented at a pressure substantially equal to 1 Pa at ambient temperature (about 20° C.). The expression "rough vacuum" (also called "primary vacuum") is understood, as is known, to mean a pressure range distinct from high vacuum (or secondary vacuum), which is usually defined as being less than 0.1 Pa.

Advantageously, said or each adhesive film may have a thickness of between 80 nm and 120 nm, said adhesive preferably being a UV-curable adhesive chosen from the group consisting of acrylate adhesives and epoxy adhesives. Even more preferably, this adhesive is a single-component epoxy adhesive, for example a liquid adhesive the viscosity of which, in the uncured state and in normal ambient conditions, is between 20 mPa·s and 40 mPa·s (the expression "normal ambient conditions" is understood, as is known, to mean a temperature of 20° C., a relative humidity of 65% and an atmospheric pressure of 101,325 Pa).

According to another feature of the invention, each of said inorganic layers may be formed by a thin film having a thickness of less than 200 nm, which is based on at least one dielectric compound compatible with the compound of each adjacent organic layer, and which is preferably obtained by atomic layer deposition (ALD), chemical vapor-enhanced deposition whether plasma assisted or not (PECVD or CVD), or physical vapor deposition (PVD). This dielectric compound is preferably chosen from the group consisting of compounds of formula $SiO_x$, $SiN_x$, $SiO_xN_y$, ZnSe, ZnO, $Sb_2O_3$, aluminum oxides and transparent conductive oxides (TCOs), especially indium tin oxides.

Preferably, each inorganic layer is obtained by ALD, and may then have a thickness of between 20 nm and 50 nm. In this case, each dyad may advantageously have a thickness of between 90 nm and 130 nm.

According to an advantageous embodiment of the invention, said device may comprise a semiconductor substrate coated on at least one of its sides with a light-emitting unit (for example comprising OLEDs, it being specified that any other light-emitting component could be used) comprising at least two electrodes, an internal electrode and an external electrode, between which is sandwiched a light-emitting structure and at least one of which is transparent to the emitted light, and said encapsulation structure then covers said external electrode.

In accordance with this embodiment of the invention, the dyads of the encapsulation structure covering the light-emitting unit are advantageously at least four in number, and this structure may then have a total thickness substantially equal to 500 nm in the case where it comprises five of these dyads.

Also in accordance with this embodiment of the invention, said device may be furthermore provided with a protective sheet bonded under pressure onto the light-emitting unit surmounted by said encapsulation structure (this sheet may be made of a material transparent to the light emitted by the light-emitting unit, such as glass or a plastic).

In the particular case of a display device comprising a color microdisplay, it will be noted that this protective sheet may be provided with optical color filters, or color changing means, on its assembly side, such that these filters, or these means, are placed facing corresponding color dots of each of the pixels of the microdisplay.

In this case, and as indicated above in relation to microdisplays on CMOS substrates, the reduced thickness of the encapsulation structure of the invention makes it possible to minimize the total distance separating the pixels of the microdisplay from the color filters placed on the internal side of the protective sheet (the thickness of the adhesive applied under this sheet being unchanged), thus improving the aperture ratio of the microdisplay.

An encapsulation process, according to the invention, for encapsulating a device as defined above comprises the following steps in succession:

a) an internal inorganic layer which has a thickness of less than 200 nm is deposited on at least one external side of this device, for example on an external electrode of a light-emitting unit, by means of ALD, PECVD or CVD, or PVD, this internal layer preferably being based on at least one dielectric compound chosen from the group consisting of compounds of formula $SiO_x$, $SiN_x$, $SiO_xN_y$, ZnSe, ZnO, $Sb_2O_3$, aluminum oxides and transparent conductive oxides (e.g. indium tin oxides);

b) this internal inorganic layer is coated (for example using a spinner or any other appropriate means e.g. dip coating) with an adhesive organic layer based on an electromagnetic-radiation-curable or heat-curable adhesive, the organic layer thus obtained having a thickness for example of between 500 nm and 1 μm;

c) the organic layer thus obtained is exposed to vacuum, preferably a rough vacuum, so as to convert it into an adhesive film uniformly less than 200 nm in thickness, thus obtaining a first dyad comprising two layers, an inorganic layer and an organic layer;

d) at least one other dyad comprising two layers—an inorganic layer and an organic layer—are deposited in succession by repeating steps a) to c), an intermediate inorganic layer being deposited in place of the internal inorganic layer of step a) and analogous to the latter; then e) a final external inorganic layer, analogous to the or each intermediate inorganic layer, is deposited on the adhesive film of the last dyad, it being specified that the adhesive film of each dyad is cured, by said electromagnetic radiation or using heat, separately or else all the adhesive films are cured together after these dyads have been obtained (the latter case is possible only if step d) is compatible with the uncured underlying adhesive film).

Advantageously, the adhesive film of each dyad is cured before the subsequent deposition of step d).

It will be noted that one advantage of this encapsulation process, compared with a Barix® vacuum-evaporation process, is the time saved during the exposure to vacuum in step c) according to the invention, the duration of this operation not exceeding one minute.

As indicated above, the adhesive used for each organic film is preferably cured by UV radiation, this possibly being an acrylate or epoxy adhesive in the most preferable case, the thickness obtained for the adhesive film of each dyad preferably being between 80 nm and 120 nm. It will be noted that several or each of the adhesive films of the structure according to the invention could comprise, in addition to said adhesive, one or more additives such as a surfactant.

It will be noted that this ALD, which is preferably chosen to obtain each inorganic film of the structure according to invention, may be carried out at a low temperature and allows a high-density layer having greatly reduced permeability to be obtained, which film conforms as closely as possible to any microreliefs or nanoreliefs in the surface concerned.

BRIEF DESCRIPTION OF THE DRAWINGS

Other advantages, features and details of the invention will become clear from the remaining description which follows with reference to the appended drawings, given merely by way of example, in which.

DETAILED DESCRIPTION OF THE INVENTION

Figure 1:
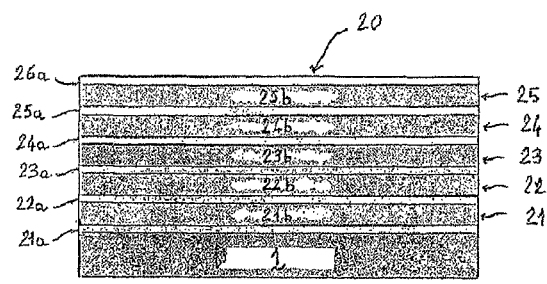
FIG. 1 is a schematic view in cross section illustrating a multilayer encapsulation structure, according to an exemplary embodiment of the invention, surmounting an optoelectronic device.

The multilayer encapsulation structure 20 illustrated in FIG. 1 covers the external side of an optoelectronic device 1 (e.g. the emission side of a light-emitting device 1), the sensitive components of which are to be protected from moisture and oxygen in the ambient air. This impermeable encapsulation structure 20 comprises five dyads 21 to 25 each consisting of a thin inorganic layer 21a to 25a coated with an organic layer, which forms a cured adhesive film 21b to 25b of reduced thickness and is sandwiched between two inorganic layers 21a and 22a, 22a and 23a, 23a and 24a, 24a and 25a, including the outermost organic layer 25b. In fact, the latter is covered by a thin external inorganic layer 26a which defines the exterior side of the encapsulation structure 20. It should be noted that these various layers in FIG. 1 are not shown at the scale of their respective thicknesses and lengths in the plane of the cross section.

Figure 2:
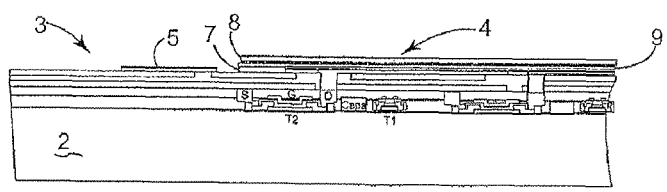
FIG. 2 is a schematic view in cross section of a microdisplay optoelectronic device, according to an embodiment of the invention, which is able to receive the encapsulation structure of FIG. 1.
Figure 3:
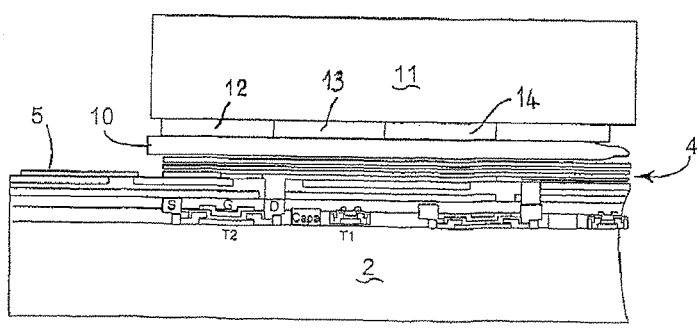
FIG. 3 is a schematic view in cross section of the optoelectronic device of FIG. 2, on which has furthermore been bonded a protective sheet provided with color filters and which may also incorporate the structure, according to the invention, of FIG. 1.

The first internal dyad 21 of the structure 20 may be deposited on the device 1 by performing the following steps in succession:

first, preferably using the ALD technique, a transparent dielectric compound, for example of formula $SiO_x$, $SiN_x$, $SiO_xN_y$, ZnSe, ZnO, $Sb_2O_3$, $Al_2O_3$, or $In_2O_3/SnO_2$ is deposited on the external side of the device 1 (e.g. on an external electrode 9 of the light-emitting unit, see FIGS. 2 and 3), so as to form an internal inorganic layer 21a of very small thickness which is advantageously between 20 nm and 30 nm;

this internal inorganic layer 21a is coated, for example using a spinner, with an adhesive organic layer based on a UV-curable adhesive, preferably a high-vapor-pressure single-component liquid epoxy adhesive (such as those sold by Epoxy Technology under the generic name "OG", the adhesive OG146 being preferred, and optionally having a surfactant added thereto, for example a nonionic surfactant, sold by 3M under the name FC4430), the organic layer thus obtained having a thickness of between 500 nm and 1 μm;

this organic layer is exposed to a rough vacuum for 60 seconds at about 20° C. and at a pressure of 1 Pa, to reduce its thickness to about 100 nm, the very-thin adhesive film 21b to 25b which is thus obtained having an advantageously uniform thickness; then the adhesive film 21b to 25b thus obtained is cured by exposure to UV radiation for about 40 s.

To obtain each of the other dyads 22 to 25 of the encapsulation structure 20 these operations are repeated, finally depositing the last, external inorganic layer 26a on the last dyad 25. Thus, n organic layers and n+1 inorganic layers, in alternation, are obtained (n=5 in the example of FIG. 1, it being understood that n could take other values depending on the impermeability characteristics required for the structure 20, n being at least equal to two).

It will be noted that this encapsulation process according to the invention is advantageously carried out in a smaller amount of time compared with the Barix® encapsulation process wherein the organic polymer layers are deposited by vacuum evaporation.

The optoelectronic device 1 illustrated in the example of FIGS. 2 and 3 is for example an OLED microdisplay, comprising, as is known, a substrate 2, typically made of silicon, coated with a light-emitting unit 3 defining an active region 4 and an electrical connection region 5. The light-emitting unit 3 comprises two electrodes, an internal electrode 7 and an external electrode 8, between which is sandwiched a light-emitting structure 9, at least one of the electrodes 8 (in this example the external electrode) being transparent or semi-transparent to the light emitted by the structure 9 so that the light emitted is made to propagate towards the exterior of the device 1 via the active region 4.

The external electrode 8 is preferably made from a metal such as silver, aluminum or samarium for the transparency properties of these metals in the visible range and for their electrical conductivity at small thicknesses (the thickness of the external electrode 8 is for example between 10 nm and 30 nm). The OLED emitting structure 9 for example consists of a multilayer of organic films designed to transfer electrons and holes from the electrodes 7 and 8, these electrons and holes being recombined to generate excitons and therefore light emission.

As illustrated in FIG. 3, the light-emitting unit 3 may be fitted, using an adhesive 10 (preferably an acrylate or epoxy adhesive, also UV-curable) with a protective sheet 11, for example made of glass or plastic, which is provided, on its internal side, with optical color filters 12, 13, 14 placed facing corresponding color dots of each pixel of the microdisplay 1. This adhesive 10 is applied, in the uncured state, in a way known per se, onto the internal side of the sheet 11 and/or of the light-emitting unit 3 surmounted by the encapsulation structure 20, then the sheet 11 is applied under pressure onto the assembly interface coated with adhesive.

It will be noted that the small thickness of the encapsulation structure 20 obtained, which is about 500 nm in the example of FIG. 1, allows the total distance between the pixels and these color filters 12, 13, 14 (including therein the thickness of the adhesive 10) to be minimized for given barrier properties, thus improving the aperture ratio of the color microdisplay 1.

The invention claimed is:

1. An organic optoelectronic device comprising organic light-emitting diodes (OLEDs), photovoltaic cells or organic thin-film transistors (TFTs), said device being coated with an impermeable multilayer encapsulation structure comprising an alternation of inorganic layers and organic layers, wherein at least one of these organic layers is formed by a cured adhesive film based on an electromagnetic-radiation-curable or heat-curable adhesive, the or each adhesive film having a thickness uniformly less than 200 nm, which thickness is obtained by exposing the as yet uncured deposited film to vacuum so that the total thickness of the encapsulation structure is minimized.

2. The device as claimed in claim 1, wherein said encapsulation structure comprises at least three dyads each comprising one of said inorganic layers and one of said organic layers.

3. The device as claimed in claim 2, wherein said inorganic layers respectively form in said structure an internal inorganic layer, at least two intermediate inorganic layers, each placed between two of said organic layers, and an external inorganic layer.

4. The device as claimed in claim 1, wherein each of said organic layers is formed by said adhesive film.

5. The device as claimed in claim 1, wherein said or each adhesive film has a thickness of 150 nm or less, which thickness is obtained by exposure to a rough vacuum implemented at a pressure substantially equal to 1 Pa.

6. The device as claimed in claim 5, wherein said or each adhesive film has a thickness of between 80 nm and 120 nm, said adhesive being a UV-curable adhesive selected from the group consisting of acrylate adhesives and epoxy adhesives.

7. The device as claimed in claim 6, wherein said adhesive is a single-component epoxy adhesive having a viscosity of which, in the uncured state and in normal ambient conditions, is between 20 mPa·s and 40 mPa·s.

8. The device as claimed in claim 1, wherein each of said inorganic layers is formed by a thin film having a thickness of less than 200 nm, which is based on at least one dielectric compound compatible with the compound of each adjacent organic layer, and which is obtained by atomic layer deposition (ALD), chemical vapor deposition whether plasma-enhanced or not (PECVD or CVD), or physical vapor deposition (PVD).

9. The device as claimed in claim 8, wherein said dielectric compound is selected from the group consisting of compounds of formula $SiO_x$, $SiN_x$, $SiO_xN_y$, ZnSe, ZnO, $Sb_2O_3$, aluminum oxides and transparent conductive oxides (TCOs).

10. The device as claimed in claim 8, wherein each inorganic layer has a thickness of between 20 nm and 50 nm and is obtained by atomic layer deposition (ALD).

11. The device as claimed in claim 2, wherein each dyad has a thickness of between 90 nm and 130 nm.

12. The device as claimed in claim 1, comprising a substrate coated on at least one of its sides with a light-emitting unit comprising at least one internal electrode and one external electrode, between which is sandwiched a light-emitting structure and at least one of the internal and external electrodes being transparent to the emitted light, wherein said encapsulation structure covers said external electrode.

13. The device as claimed in claim 3, wherein said dyads of said encapsulation structure are at least four in number.

14. The device as claimed in claim 11, wherein said encapsulation structure has a total thickness substantially equal to 500 nm in the case where it comprises five of said dyads.

15. The device as claimed in claim 12, of the color microdisplay type, wherein the device is furthermore provided with a protective sheet, which is bonded under pressure onto said light-emitting unit surmounted by said encapsulation structure, and which comprises color filters or color changing means facing corresponding color dots of each pixel of the microdisplay.

16. A process for encapsulating a device according to claim 1, wherein the process comprises the following steps in succession:
a) depositing an internal inorganic layer having a thickness of less than 200 nm on at least one external side of this device by means of atomic layer deposition (ALD), chemical vapor deposition whether plasma-enhanced or not (PECVD or CVD), or physical vapor deposition (PVD), this internal layer being based on at least one dielectric compound selected from the group consisting of compounds of formula $SiO_x$, $SiN_x$, $SiO_xN_y$, ZnSe, ZnO, $Sb_2O_3$, aluminum oxides and transparent conductive oxides (TCOs);
b) coating the internal inorganic layer with an adhesive organic layer based on an electromagnetic-radiation-curable or heat-curable adhesive, the organic film thus obtained having a thickness of between 500 nm and 1 µm;
c) exposing the adhesive organic layer thus obtained to vacuum so as to convert the adhesive coating layer into an adhesive film that is uniformly less than 200 nm in thickness, thus obtaining a first dyad comprising two layers, an inorganic layer and an organic layer;
d) forming at least one other dyad comprising two layers—an inorganic layer and an organic layer—the two layers each being deposited in succession by repeating steps a) to c), and an intermediate inorganic layer being deposited in place of the internal inorganic layer of step a) and analogous to the latter; then
e) depositing a final external inorganic layer, analogous to the or each intermediate inorganic layer, on the adhesive film of a last obtained dyad,
wherein the adhesive film of each dyad is cured, by said electromagnetic radiation or using heat, separately or else all the adhesive films are cured after these dyads have been obtained.

17. The process as claimed in claim 16, wherein said adhesive is cured by UV radiation and is selected from the group consisting of acrylate adhesives and epoxy adhesives, the thickness obtained for the adhesive film of each dyad being between 80 nm and 120 nm.

18. The process as claimed in claim 16, wherein each inorganic layer has a thickness of between 10 nm and 50 nm and is deposited by atomic layer deposition (ALD).

19. The process as claimed in claim 17, wherein each dyad has a thickness of between 90 nm and 130 nm.

* * * * *